United States Patent
Choi et al.

(10) Patent No.: US 8,072,029 B2
(45) Date of Patent: Dec. 6, 2011

(54) HIGH VOLTAGE SEMICONDUCTOR DEVICE WITH FLOATING REGIONS FOR REDUCING ELECTRIC FIELD CONCENTRATION

(75) Inventors: Yong-Cheol Choi, Gyeonggi-Do (KR); Chang-Ki Jeon, Gyunggi-Do (KR); Sang-Hyun Lee, Gyeonggi-Do (KR)

(73) Assignee: Fairchild Korea Semiconductor Ltd. (KR)

( * ) Notice: Subject to any disclaimer, the term of this patent is extended or adjusted under 35 U.S.C. 154(b) by 722 days.

(21) Appl. No.: 12/013,354

(22) Filed: Jan. 11, 2008

(65) Prior Publication Data

US 2009/0020814 A1    Jan. 22, 2009

(30) Foreign Application Priority Data

Jan. 12, 2007   (KR) .................. 10-2007-0003957

(51) Int. Cl.
*H01L 29/78* (2006.01)
(52) U.S. Cl. ................. 257/343; 257/E29.261
(58) Field of Classification Search .......... 257/328, 257/287, 339, 343, E29.261, 335, 368, E21.417, 257/E29.256
See application file for complete search history.

(56) References Cited

U.S. PATENT DOCUMENTS

| 5,258,636 | A | 11/1993 | Rumennik et al. | |
| 6,486,512 | B2 | 11/2002 | Jeon et al. | |
| 6,773,997 | B2 * | 8/2004 | Imam et al. | 438/286 |
| 2003/0193067 | A1 * | 10/2003 | Kim et al. | 257/343 |
| 2004/0178443 | A1 * | 9/2004 | Hossain et al. | 257/328 |

* cited by examiner

*Primary Examiner* — Thomas L Dickey
*Assistant Examiner* — Fazli Erdem
(74) *Attorney, Agent, or Firm* — Kilpatrick Townsend & Stockton LLP

(57) ABSTRACT

A high voltage semiconductor device includes a source region of a first conductivity type having an elongated projection with two sides and a rounded tip in a semiconductor substrate. A drain region of the first conductivity type is laterally spaced from the source region in the semiconductor substrate. A gate electrode extends along the projection of the source region on the semiconductor substrate between the source and drain regions. Top floating regions of a second conductivity type are disposed between the source and drain regions in the shape of arched stripes extending along the rounded tip of the projection of the source region. The top floating regions are laterally spaced from one another by regions of the first conductivity type to thereby form alternating P-N regions along the lateral dimension.

22 Claims, 5 Drawing Sheets

HIGH VOLTAGE SEMICONDUCTOR DEVICE WITH FLOATING REGIONS FOR REDUCING ELECTRIC FIELD CONCENTRATION

CROSS-REFERENCES TO RELATED APPLICATIONS

This application claims priority to the Korean Patent Application No. 10-2007-0003957, filed on Jan. 12, 2007 in the Korean Intellectual Property Office, the disclosure of which is incorporated herein by reference in its entirety for all purposes.

BACKGROUND OF THE INVENTION

The present invention relates to a high voltage semiconductor device, and more particularly, to a lateral double doped metal oxide semiconductor (LDMOS) transistor capable of reducing electric field concentration in a source region.

High voltage lateral double doped metal oxide semiconductor (LDMOS) transistors have been widely used as switching devices for control, logic and electric power. The LDMOS transistor is typically designed to have a high breakdown voltage and a low on-resistance so that the LDMOS transistor can sustain high voltages, conduct high currents, have low power consumption, and improved switching characteristics. In a high-voltage semiconductor device, the curvature radius of a source or drain region has a close relation with the breakdown voltage characteristic of a device. Particularly, in some LDMOS transistors, the electric field is typically high at the tip portion of a source region having a relatively small curvature radius, which can result in reduced breakdown voltage.

FIGS. 1A through 1C show simulation results of the electric field concentration around the source tip 10$t$ of a source portion 10 for three devices having source tips 10$t$ with different radius of curvatures r, r' and r". FIG. 1D shows an Id-Vd graph where the I-V curve marked as "A" corresponds to the curvature radius r of 8.5 μm (FIG. 1A), the I-V curve marked as "B" corresponds to the curvature radius r' of 18.5 μm (FIG. 1B), and the I-V curve marked as "C" correspond to the curvature radius r" of 28.5 μm (FIG. 1C) As can be seen, as the radius of the tip 10$t$ of the source portion 10 is reduced, the electric field concentration at the tip portion 10$t$ is increased, and thus the breakdown voltage of the device is reduced.

Thus, in order to obtain a high breakdown voltage due to the high electric field concentration at the tip 10$t$ of the source portion 10, the curvature radius of the tip 10$t$ of the source portion 10 needs to be increased. However, increasing the curvature radius of the tip 10$t$ of the source portion 10 disadvantageously increases the die size.

Thus there is a need for a technique which, among other advantages and features, enables reducing the curvature radius of the tip of the source without adversely impacting the device breakdown voltage.

BRIEF SUMMARY OF THE INVENTION

In accordance with embodiments of the present invention, a semiconductor device having a source with a small curvature radius tip portion is disclosed which, among other advantages and features, achieves a high breakdown voltage without increasing the on-resistance.

According to an aspect of the present invention, a high voltage semiconductor device includes a source region of a first conductivity type having an elongated projection with two sides and a rounded tip in a semiconductor substrate. A drain region of the first conductivity type is laterally spaced from the source region in the semiconductor substrate. A gate electrode extends along the projection of the source region on the semiconductor substrate between the source and drain regions. Top floating regions of a second conductivity type are disposed between the source and drain regions in the shape of arched stripes extending along the rounded tip of the projection of the source region. The top floating regions are laterally spaced from one another by regions of the first conductivity type to thereby form alternating P-N regions along the lateral dimension.

In one embodiment, a side floating region of the second conductivity type extends along each of the two sides of the projection of the source region between the source and drain regions. Both ends of each of the arched stripes of top floating regions are in contact with the side floating region.

In another embodiment, the top floating regions are disposed in a first well region of the first conductivity type that extends between the source and drain regions.

In another embodiment, the drain region is disposed in a second well region of the first conductivity type, the drain region having a higher impurity concentration than the second well region.

In yet another embodiment, the second well region extends along the two sides and around the tip of the projection of the source region, and those portions of the second well region that extend along both sides of the projection also extend under the gate electrode.

In accordance with another embodiment of the invention, a high voltage semiconductor device includes a body region of the first conductivity type in a semiconductor substrate. A source region of a second conductivity type is deposed in the body region. A first well region of the second conductivity type is disposed in the semiconductor substrate such that a portion of the first well region laterally extends to contact the body region. A drain region of the second conductivity type is disposed in the first well region. The drain region is laterally spaced from the source region. A second well region of the second conductivity type is disposed in the semiconductor substrate such that a portion of the second well region laterally extends to contact the body region. The first well region has a higher impurity concentration than the second well region. Floating regions of the first conductivity type are embedded in the first and second well regions between the source and drain regions. The floating regions are laterally spaced from one another to thereby form alternating P-N regions along the lateral dimension.

In one embodiment, the second well region has a junction depth shallower than the first well region, and the body region has a junction depth shallower than the second well region.

In another embodiment, the source region has an elongated projection with two sides and a rounded tip, and the alternating P-N regions are located directly across from the rounded tip so as to reduce an electric field concentration at the rounded tip during operation.

In accordance with yet another embodiment of the invention, a laterally conducting semiconductor transistor includes a body region of a first conductivity type disposed in a semiconductor substrate. A source region of a second conductivity type disposed in the body region includes an elongated projection with two sides and a rounded tip. A first well region of the second conductivity type disposed in the semiconductor substrate has a portion that extends around the tip of the projection and is in contact with the body region. A drain region of the second conductivity type is laterally spaced from the source region. The transistor further includes floating regions of the first conductivity type with portions that are disposed in the first well region between the source and drain regions in the shape of arched stripes extending along the rounded tip of the projection of the source region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
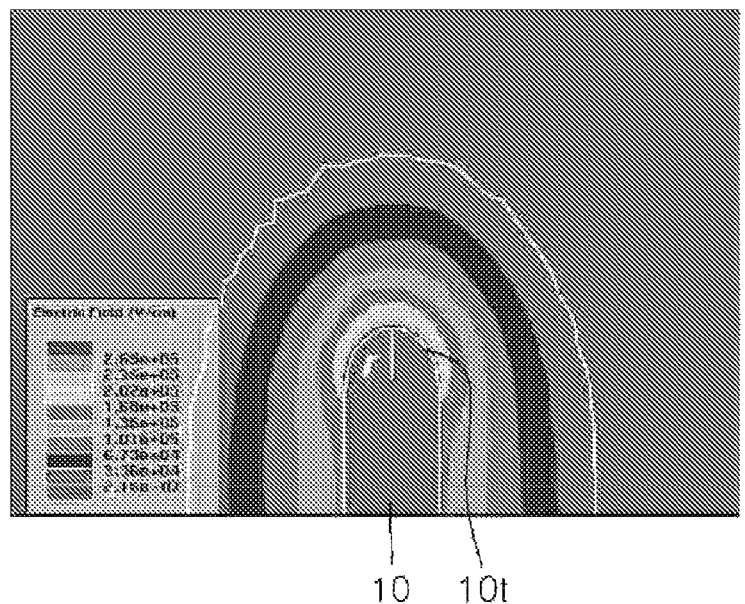
FIGS. 1A though 1C are simulation results showing the impact of changing the radius of curvature at source tip regions on electric field concentration in conventional devices.
Figure 1B:
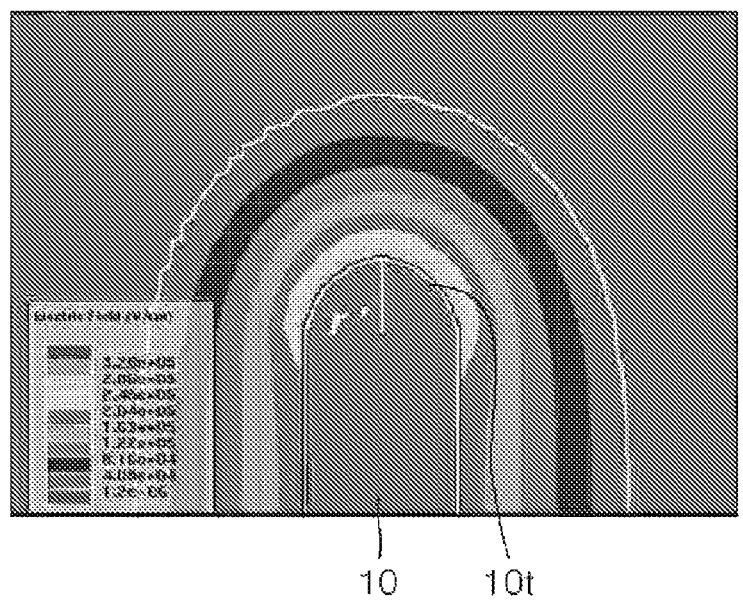
FIG. 1D is an Id-Vd graph showing the relationship between the radius of a source tip portion and the breakdown voltage for the devices in FIGS. 1a-1C.
Figure 1C:
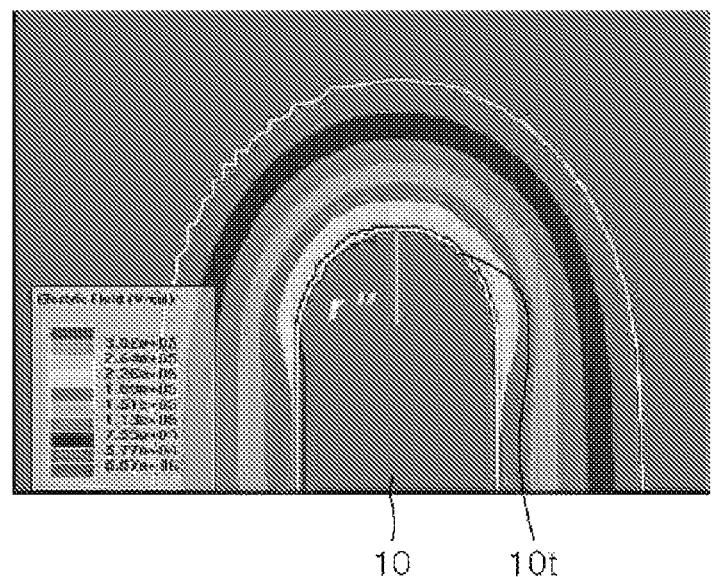
Figure 1D:
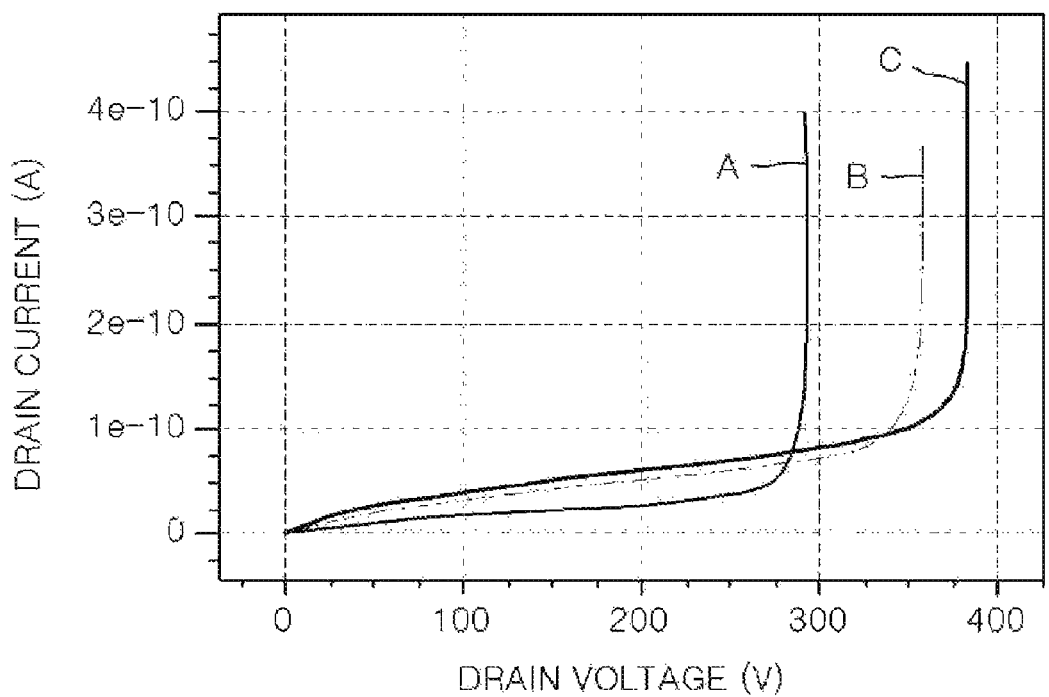

The present invention will be described more fully hereinafter with reference to the accompanying drawings in which exemplary embodiments of the invention are shown. This invention may be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes of elements and the like are exaggerated for clarity. Like numbers refer to like elements throughout the specification and the drawings.

Figure 2:
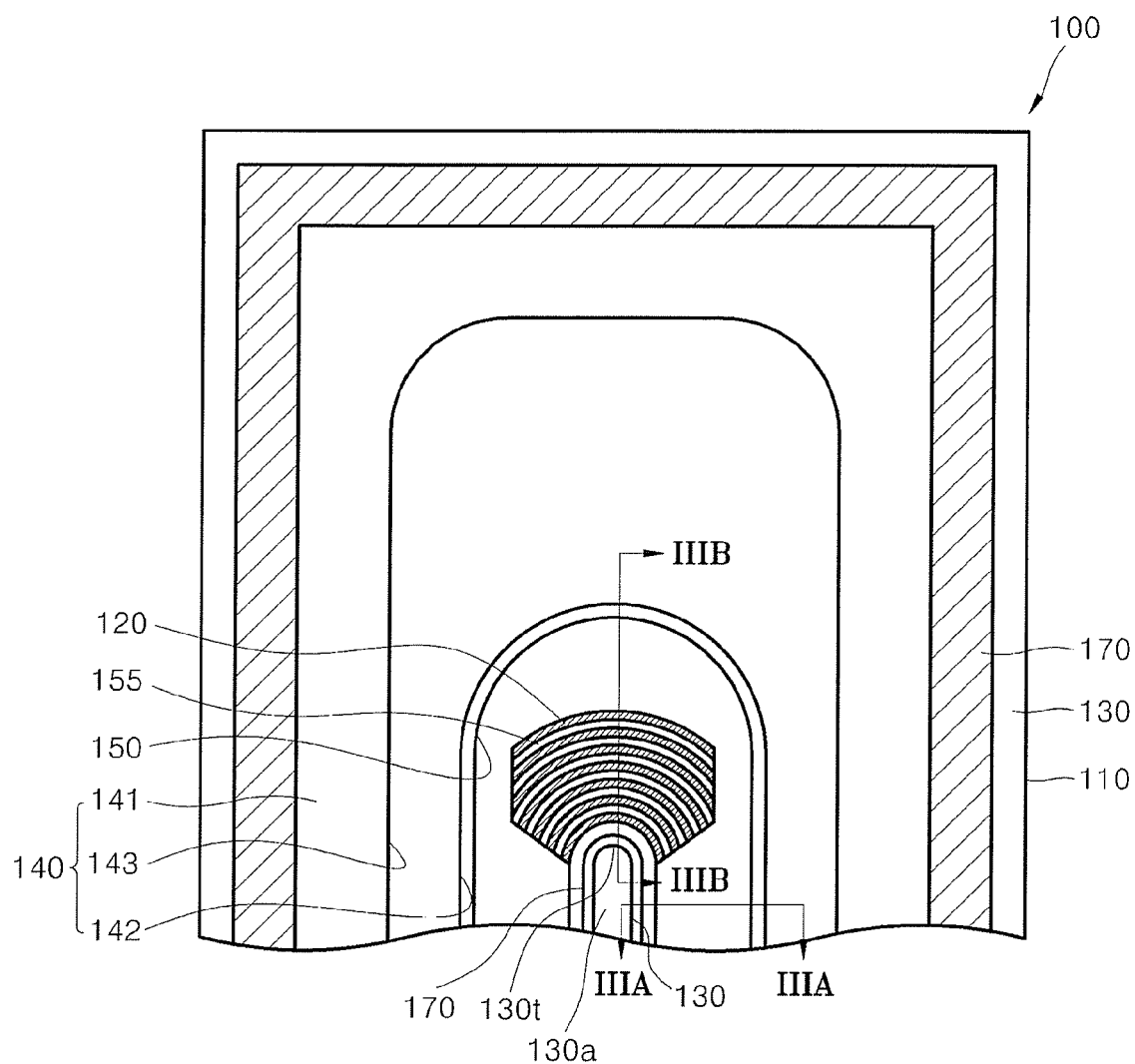
FIG. 2 is a plan view of a high voltage semiconductor device according to an exemplary embodiment of the present invention.
Figure 3A:
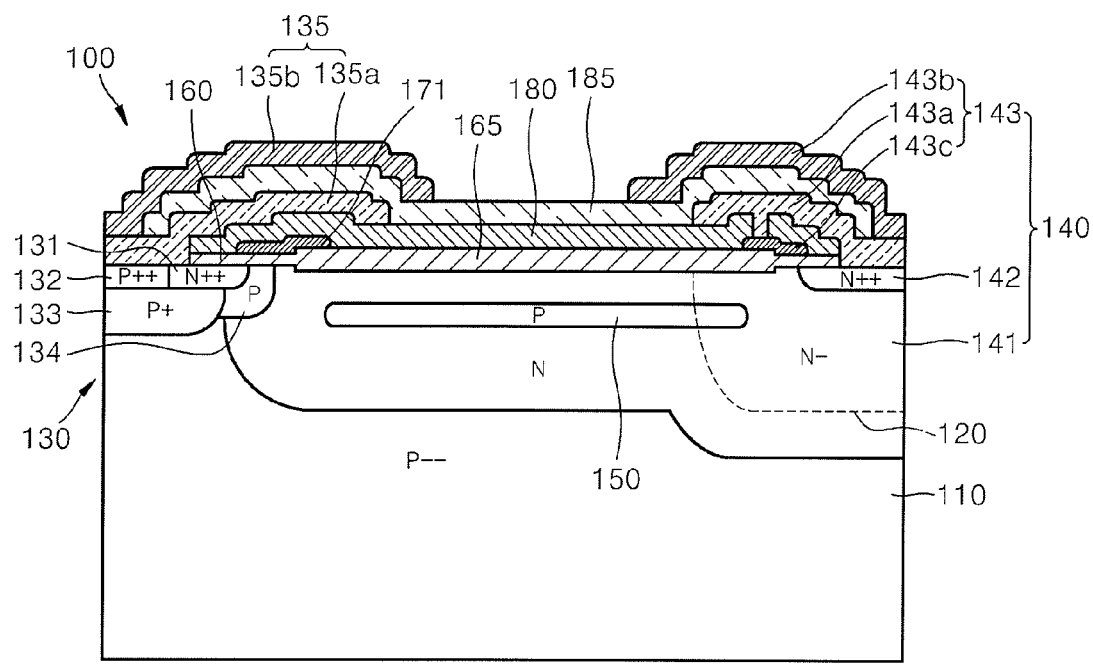
FIG. 3A is a cross-sectional view taken along line IIIA-IIIA of FIG. 2.
Figure 3B:
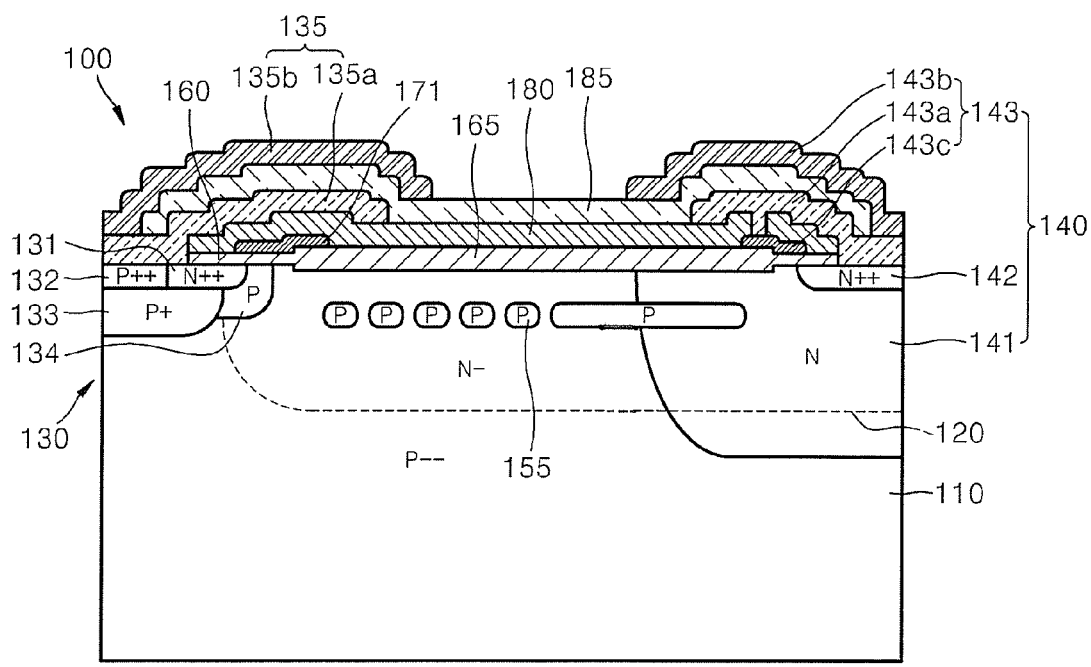
FIG. 3B is a cross-sectional view taken along line IIIB-IIIB of FIG. 2.

FIG. 2 is a plan view of a portion of a die housing a high voltage LDMOS transistor 100 according to an embodiment of the present invention. FIG. 3A is a cross-sectional view taken along line IIIA-IIIA of FIG. 2, and FIG. 3B is a cross-sectional view taken along line IIIB-IIIB of FIG. 2. Referring to FIGS. 2, 3A and 3B, transistor 100 includes a semiconductor substrate 110, a source portion 130, a gate portion 170 and a drain portion 140. The source portion 130 has an elongated projection 130a terminating at a tip portion 130t, and is positioned in the semiconductor substrate 110 to surround the projection 130a. The drain portion 140 is positioned in the semiconductor substrate 110 surrounded by the source portion 130. The gate portion 170 is positioned along the projection 130a and between the source and drain portions 130 and 140. A P-type side floating region 150 extends along the two sides of projection 130a between the gate portion 170 and drain portion 140. Side floating region 150 extends in an N-type well region 141. A plurality of P-type top floating regions 155 at the top of projection 130a extend along an outer circumferential surface of the tip portion 130t and are laterally spaced from one another. Each of top floating regions 155 has an arched stripe shape with both ends of each stripe being in contact with the side floating region 150. Top floating regions 155 extend in an N$^-$-type well region 120 thereby forming alternating P-N regions along the lateral dimension between the source and drain portions.

The source portion 130 includes a high-concentration N$^{++}$-type source region 131 disposed in a P-type body region 134. A P$^{++}$-type plug region 132 is formed in body region 134 adjacent to the N$^{++}$-type source region 131. A P$^+$-type deep body region 133 extends through body region 134 and laterally extends under the N$^{++}$-type source region 131.

The source portion 130 further includes a source electrode 135 having first and second metal interconnections 135a and 135b formed on the semiconductor substrate 110 to come into contact with the N$^{++}$-type source region 131 and P$^{++}$-type plug region 132. The first metal interconnection 135a is formed on a first insulating layer 180 and comes into contact with the N$^{++}$-type source region 131 and P$^{++}$-type plug region 132, and the second metal interconnection 135b is formed on a second insulating layer 185 and comes into contact with the first metal interconnection 135a. The source electrode 135 may alternatively include only one metal interconnection.

The drain portion 140 includes N$^{++}$-type drain region 142 formed in the N-type well region 141, and a drain electrode 143 coming into contact with the N$^{++}$-type drain region 142. The drain electrode 143 includes a first metal interconnection 143a which is formed on the first insulating layer 180 and comes into contact with the N$^{++}$-type drain region 142, and a second metal interconnection 143b which is formed on the second insulating layer 185 and comes into contact with the first metal interconnection 143a. First metal interconnection 143a also contacts a conductor 143c that is formed on an insulating layer 160. Alternatively, the drain electrode 143 may include only one metal interconnection layer.

N-type well region 141 has a junction depth deeper than the drain region 142. Along the sides of source projection 130a, N-type well region 141 laterally extends from under drain region 142 toward source region 160 and contacts a portion of the P-type body region 134, as depicted in FIG. 3A. FIG. 3A further shows side floating region 150 laterally extending in N-type well region 141 between source region 160 and drain region 142. Along the top of source projection 130a, N-type well region 141 is pulled away from the source side and terminates near the drain region, as depicted in FIG. 3B.

Along the top of source projection 130a, N$^-$-type well region 120 laterally extends from under drain region 142 toward source region 160 and contacts a portion of body region 134, as depicted in FIG. 3B. Along the top of source projection 130a, N$^-$-type well region 120 is pulled away from the source side and terminates near the drain region, as depicted in FIG. 3A. The P-type top floating regions 155 extend in N$^-$-type well region 120 and are spaced from each other. Top floating regions 155 are in the shape of arched stripes extending along the outer circumferential surface of the tip 130t of the source portion 130. The P-type top floating regions 155 are spaced from the surface of the semiconductor substrate 110 by the same depth as the side floating region 150. Both ends of each of the top floating regions 155 are in contact with the side floating region 150. The top floating regions 155 may be simultaneously formed and at the same impurity concentration as the side floating region 150. The N$^-$-type well region 120 is formed to have a junction depth sallower than at least some portions of the N-type well region 141 and to have an impurity concentration lower than the N-type well region 141 and the floating regions 150 and 155. By forming top floating regions 155 in N$^-$-type well region 120, alternating P-N regions are advantageously formed along the lateral dimension between source portion 130 and drain portion 140 as shown.

The gate portion 170 includes a gate electrode 171 extending on a gate insulating layer 160 which insulates gate electrode 171 from its underlying body region 134. A field oxide layer 165 extends on the semiconductor substrate 110 between the source and drain portions 130 and 140. As is evident from the above description, the term "source portion" as used herein refers to the general vicinity where the source region is formed. Similarly, the term "drain portion" as used herein refers to the general vicinity where the drain region is formed. Further, the term "floating region" as used herein means a region that is not connected to an externally provided potential either directly or through another region of similar conductivity type.

During operation, the top floating regions 155 advantageously distribute the electric field at tip portion 130t more uniformly thus reducing the electric field concentration at the tip of the source projection. The breakdown voltage of the semiconductor device 100 can thus be increased. Also, since one or both of the N-type well region 141 and N⁻-type well region 120 extend from drain region 142 all the way to body region 134 all around the tip portion 130a and sides of source projection 130a, the on-resistance of the semiconductor device 100 is reduced. This is in contrast to conventional designs where the well regions are spaced from the body region in order to obtain improved device characteristics. Further, the particular design shown in FIGS. 2, 3A, 3B includes the freewheeling diode under the drain pad resulting in improved electro static discharge (ESD) protection.

Figure 4:
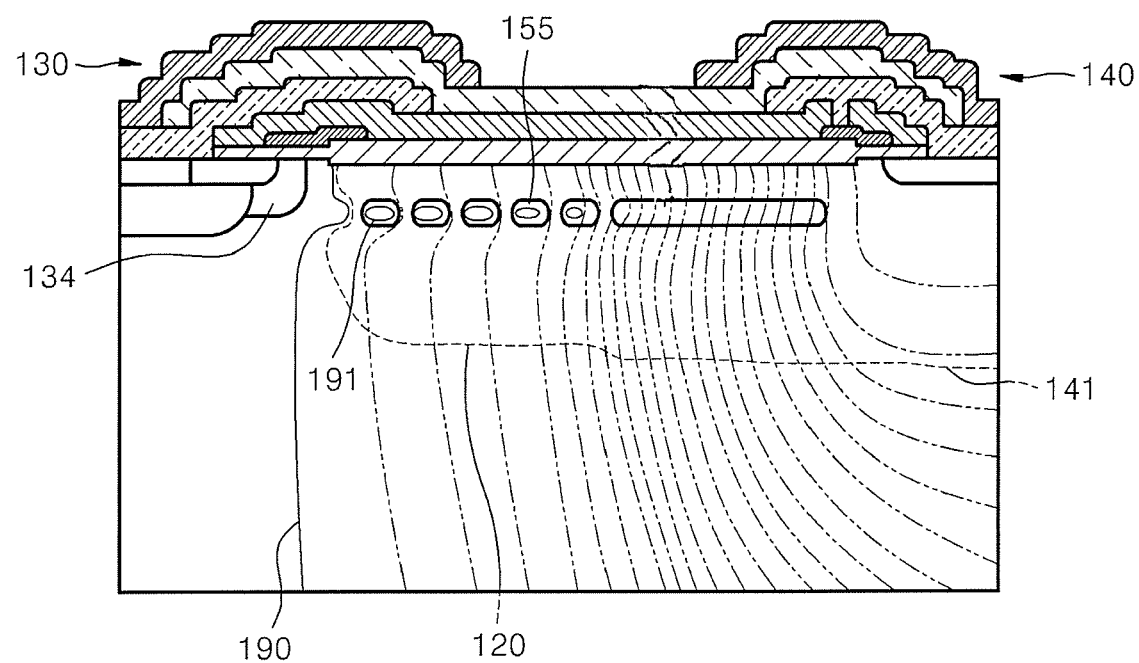
FIG. 4 is a cross-sectional view showing an electric potential distribution in a high voltage semiconductor device according to the an exemplary embodiment of the present invention.

FIG. 4 illustrates electric potential distribution of a high voltage semiconductor device having an N⁻-type well adjacent to a tip of a source portion and P-type floating regions formed in the N⁻-type well. The cross section view in FIG. 4 is similar to that in FIG. 3B. Referring to FIG. 4, because of the presence of floating P-regions 155 in an N-well (and the resulting alternating P-N structure) around the tip of the source projection, the depletion regions 191 are formed at junctions between the floating regions 155 and the N⁻-type well region 120, and depletion regions 190 are formed at junctions between P-type body region 134 and the N⁻-type well region 120, as shown. Accordingly, a more uniform electric field distribution is obtained between the source and drain portions 130 and 140 so that the breakdown voltage of the semiconductor device is increased. Thus, for the same breakdown voltage, this design enables reducing the radius curvature at the tip of the source projection, resulting in a smaller die size.

As described in detail above, in a high voltage semiconductor device of the present invention, an N⁻-type well is formed in a semiconductor substrate between source and drain portions, and P-type floating regions are arranged in the N⁻-type well to be spaced apart from one another along an outer circumferential surface of a tip of the source portion, so that the breakdown voltage of the semiconductor device can be increased. Further, the N-type well region 141 and N⁻-type well region are designed so that the on-resistance of the semiconductor device can be decreased as compared with conventional designs in which an N-type drift region does not exist at least along an outer circumferential surface of a tip of a source portion. Furthermore, since a source region is positioned to surround an N-type well in the high voltage semiconductor device, the current capability of the transistor is further increased. ESD is also improved by the presence of the freewheeling diode under the drain pad. Note that while embodiments of the invention have been described using an N-channel LDMOS transistor, the invention is not limited as such. For example, a P-channel LDMOS transistor variation of the transistors described herein may be obtained by merely reversing the polarity of the various regions.

Thus, while the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high voltage semiconductor device, comprising:
a semiconductor substrate;
a source region of a first conductivity type having an elongated projection with two sides and a rounded tip in the semiconductor substrate;
a drain region of the first conductivity type laterally spaced from the source region in the semiconductor substrate;
a gate electrode extending along the projection of the source region on the semiconductor substrate between the source and drain regions;
a side floating region of a second conductivity type disposed between the source and drain regions along each of the two sides of the source region; and
top floating regions of the second conductivity type contacting the side floating region, the top floating regions disposed between the source and drain regions in the shape of arched stripes extending along the rounded tip of the projection of the source region, the top floating regions being laterally spaced from one another by regions of the first conductivity type to thereby form alternating P-N regions along the lateral dimension.

2. The high voltage semiconductor device of claim 1 wherein the side floating region and the top floating regions are disposed at the same depth from a surface of the semiconductor substrate.

3. The high voltage semiconductor device of claim 1 wherein both ends of each of the arched stripes of the top floating regions are in contact with the side floating region.

4. The high voltage semiconductor device of claim 1, wherein the top floating regions are disposed in a first well region of the first conductivity type that extends between the source and drain regions.

5. The high voltage semiconductor device of claim 4, wherein the first well region further extends along the two sides and around the tip of the projection of the source region, those portions of the first well region that extend along the two sides of the projection do not extend under the gate electrode, and those portions of the first well region that extend around the tip of the projection do extend under the gate electrode.

6. The high voltage semiconductor device of claim 5, wherein the source region is disposed in a body region of the second conductivity type, the gate electrode extends over but is insulated from the body region, and those portions of the first well region that extend around the tip of the projection contact the body region.

7. The high voltage semiconductor device of claim 1 wherein the side floating region is disposed in a well region of the first conductivity type which extends under the gate electrode.

8. The high voltage semiconductor device of claim 4, wherein the drain region is disposed in a second well region of the first conductivity type, the drain region having a higher impurity concentration than the second well region.

9. The high voltage semiconductor device of claim 8, wherein the first well region has a junction depth sallower than at least a portion of the second well region, and the first well region has an impurity concentration lower than the second well region.

10. The high voltage semiconductor device of claim 8, wherein the second well region extends along the two sides and around the tip of the projection of the source region, and those portions of the second well region that extend along both sides of the projection also extend under the gate electrode.

11. A high voltage semiconductor device, comprising:
a semiconductor substrate;
a body region of the first conductivity type in the semiconductor substrate;
a source region of a second conductivity type in the body region, wherein the source region has an elongated projection with two sides and a rounded tip;
a first well region of the second conductivity type in the semiconductor substrate, the first well region laterally extending to contact the body region;
a drain region of the second conductivity type in the first well region, the drain region being laterally spaced from the source region;
a second well region of the second conductivity type in the semiconductor substrate, the second well region laterally extending to contact the body region, the first well region having a higher impurity concentration than the second well region;
a side floating region of the first conductivity type disposed between the source and drain regions along each of the two sides of the source region; and
floating regions of the first conductivity type contacting the side floating region, the floating regions embedded in the first and second well regions between the source and drain regions, the floating regions being laterally spaced from one another to thereby form alternating P-N regions along the lateral dimension.

12. The high voltage semiconductor device of claim 11, wherein the second well region has a junction depth shallower than the first well region, and the body region has a junction depth shallower than the second well region.

13. The high voltage semiconductor device of claim 11, wherein the alternating P-N regions are located directly across from the rounded tip so as to reduce an electric field concentration at the rounded tip during operation.

14. The high voltage semiconductor device of claim 11 further comprising a gate electrode extending over but being insulated from the body region.

15. The high voltage semiconductor device of claim 11, wherein during operation a current flows laterally between the drain and source regions.

16. The high voltage semiconductor device of claim 11, wherein the first well region contacts the body region along the two sides of the projection but not along the tip of the projection.

17. The high voltage semiconductor device of claim 11 wherein the second well region contacts the body region along the tip of the projection but not along the two sides of the projection.

18. A laterally conducting semiconductor transistor comprising:
a semiconductor substrate;
a body region of a first conductivity type in the semiconductor substrate;
a source region of a second conductivity type in the body region, the source region including an elongated projection with two sides and a rounded tip;
a first well region of the second conductivity type in the semiconductor substrate, the first well region having a portion extending around the tip of the projection and being in contact with the body region;
a drain region of the second conductivity type laterally spaced from the source region;
a side floating region of the first conductivity type disposed between the source and drain regions along each of the two sides of the source region; and
floating regions of the first conductivity type contacting the side floating region, the floating regions having portions that are disposed in the first well region between the source and drain regions in the shape of arched stripes extending along the rounded tip of the projection of the source region, the floating regions being laterally spaced from one another by regions of the second conductivity type.

19. The laterally conducting semiconductor transistor of claim 18 wherein the first well region further includes portions that extend along the two sides of the projection of the source region and do not contact the body region.

20. The laterally conducting semiconductor transistor of claim 18 further comprising a second well region of the second conductivity type in the semiconductor substrate, the second well region having a higher impurity concentration than the first well region, the drain being disposed in the second well region, the second well region having a portion that extends around the tip of the projection but does not contact the body region.

21. The laterally conducting semiconductor transistor of claim 20 wherein the second well region further includes portions that extend along the two sides of the projection and are in contact the body region.

22. The laterally conducting semiconductor transistor of claim 20 wherein ends of each of the arched stripes of the floating regions are in contact with the side floating region.

* * * * *